(12) United States Patent
Hoeltke et al.

(10) Patent No.: US 9,869,835 B2
(45) Date of Patent: Jan. 16, 2018

(54) DEVICE FOR INCOUPLING AND/OR OUTCOUPLING OPTICAL SIGNALS

(71) Applicant: SILICON LINE GMBH, Munich (DE)

(72) Inventors: Holger Hoeltke, Munich (DE); Martin Groepl, Sonthofen Oberallgaeu (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 14/925,429

(22) Filed: Oct. 28, 2015

(65) Prior Publication Data

US 2016/0154191 A1    Jun. 2, 2016

Related U.S. Application Data

(63) Continuation of application No. PCT/DE2014/200187, filed on Apr. 29, 2014.

(51) Int. Cl.
| | |
|---|---|
| *H04B 10/40* | (2013.01) |
| *G02B 6/42* | (2006.01) |
| *H05K 1/18* | (2006.01) |
| *H04B 10/80* | (2013.01) |
| *H05K 1/02* | (2006.01) |
| *H05K 1/11* | (2006.01) |

(52) U.S. Cl.
CPC .......... *G02B 6/428* (2013.01); *G02B 6/4257* (2013.01); *H04B 10/801* (2013.01); *H05K 1/18* (2013.01); *G02B 6/4278* (2013.01); *G02B 6/4284* (2013.01); *H05K 1/0274* (2013.01); *H05K 1/117* (2013.01); *H05K 1/182* (2013.01); *H05K 2201/09063* (2013.01); *H05K 2201/10121* (2013.01); *H05K 2201/10446* (2013.01)

(58) Field of Classification Search
CPC ...................................................... H04B 10/40
See application file for complete search history.

(56) References Cited

U.S. PATENT DOCUMENTS

| | | | | |
|---|---|---|---|---|
| 5,937,125 | A * | 8/1999 | Creswick | G02B 6/4277 385/75 |
| 6,222,665 | B1 | 4/2001 | Neuner et al. | |
| 2001/0010744 | A1 * | 8/2001 | Shuto | G02B 6/4201 385/92 |
| 2010/0215312 | A1 | 8/2010 | Daikuhara et al. | |
| 2012/0121272 | A1 | 5/2012 | Kropp | |
| 2013/0279853 | A1 * | 10/2013 | Lam | G02B 6/32 385/33 |

OTHER PUBLICATIONS

International Search Report issued in Application No. PCT/DE2014/200187, dated Nov. 12, 2014.

* cited by examiner

*Primary Examiner* — Shi K Li

(74) *Attorney, Agent, or Firm* — Studebaker & Brackett PC

(57) ABSTRACT

In order to further develop a device for coupling optical signals into at least one waveguide, wherein the device comprises at least one send-site circuit, which based on incoming signals from send-site terminal contacts actuates at least one electro-optical converter, which sends out the optical signals in the direction of the axis of the waveguide, in such a way that a corresponding miniaturization of the coupling device is enabled at low optical losses while at the same time the manufacturing expenses are to be low, it is proposed that the send-site circuit is arranged essentially in the plane of a send-site substrate comprising the send-site terminal contacts.

The corresponding is true for a device for decoupling optical signals from at least one waveguide.

16 Claims, 5 Drawing Sheets

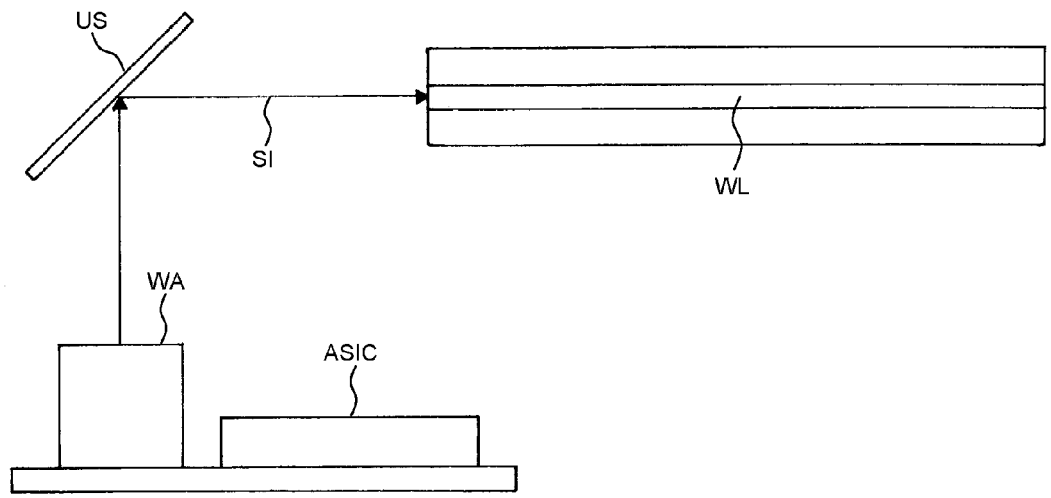
Fig. 1 (= Stand der Technik = prior art)
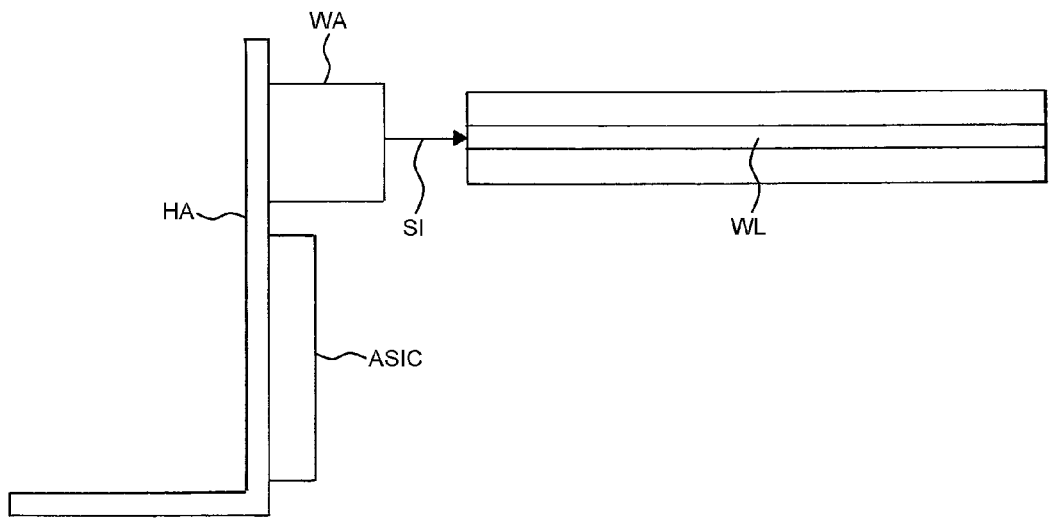
Fig. 2 (= Stand der Technik = prior art)

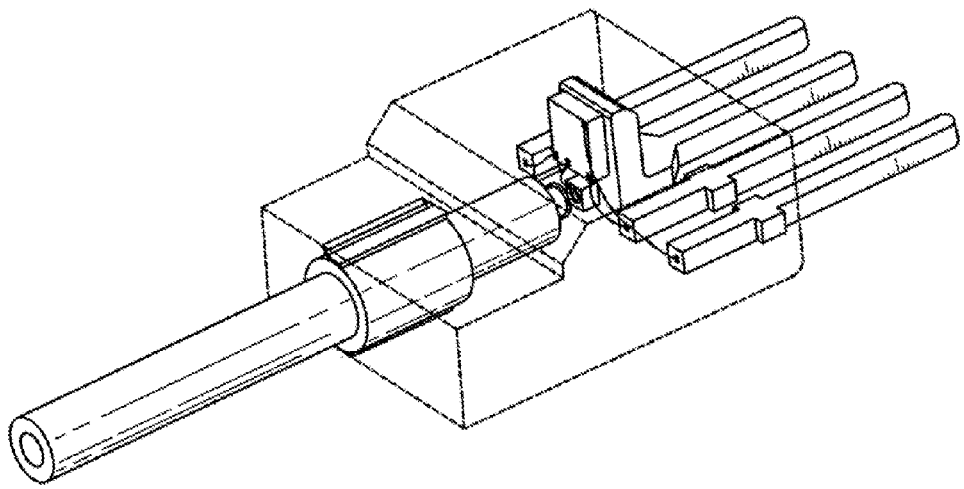
Fig. 3 (= Stand der Technik = prior art)
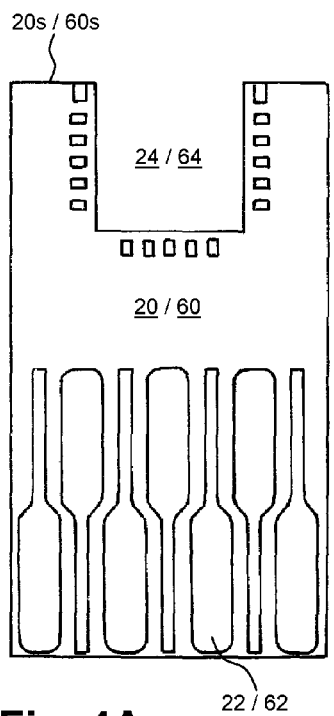
Fig. 4A
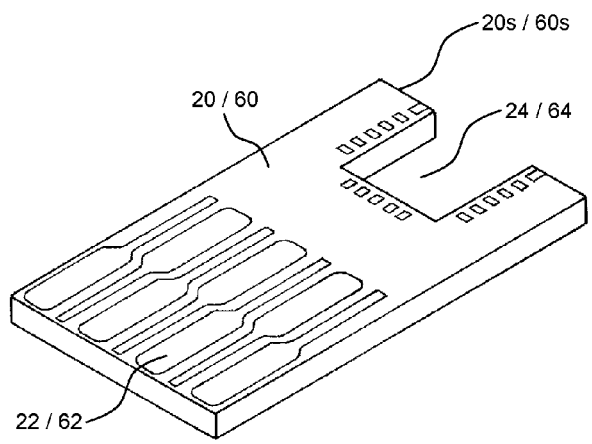
Fig. 4B

DEVICE FOR INCOUPLING AND/OR OUTCOUPLING OPTICAL SIGNALS

CROSS-REFERENCE TO RELATED APPLICATIONS

This application is a continuation of international (WO) patent application no. PCT/DE2014/200187, filed 29 Apr. 2014, which claims the respective priority
of German (DE) patent application no. 10 2013 104 367.4, filed 29 Apr. 2013, and
of German (DE) patent application no. 10 2013 104 787.4, filed 8 May 2013,
the contents of each being hereby incorporated herein by reference.

FIELD OF THE INVENTION

The present invention relates to a device for coupling optical signals into at least one waveguide.

The present invention further relates to a complementary device for decoupling optical signals from at least one waveguide.

FIELD OF THE INVENTION

As optical converters, in particular as active optical converters, vertical cavity surface emitting lasers (VCSEL) or photodiodes (PD) send or receive optical signals essentially perpendicular to their surface.

In order to couple such optical signals SI into an optical waveguide WL or decouple them from an optical waveguide WL, the optical signals SI are to be deflected by a 45 degree deflection mirror from the transmitting or receiving direction of the optical converter WA into a plane of the waveguide WL offset by ninety degrees, as may be taken from FIG. 1.

Publication DE 10 2012 005 618 A1 describes an active optical cable, whose fibers are materially bonded to an optical substrate. The fibers here become coupled with an integrated optical waveguide. A deflection element guides the free jet to the processing unit located on the substrate surface, wherein the free jet undergoes a directional change of ninety degrees, so as to direct the free jet into a transceiver unit.

Alternatively, optical converters WA can be arranged by means of a corresponding bracket HA in such a way that their transmitting or receiving direction corresponds to the plane of the waveguide WL, as may be taken from FIG. 2 and FIG. 3.

The disadvantage to the solutions known from prior art involves the frame size of the coupling and decoupling devices. This frame size makes the known solutions unsuitable for the realization of applications involving the home and mobile electronics. This implies longer connection paths between the components, and thus longer latency periods.

OBJECTS AND SUMMARY OF THE INVENTION

Starting from the above-explained disadvantages and shortcomings as well as taking the outlined prior art into account, the object of the present invention is to further develop a coupling device of the above-mentioned type as well as a decoupling device of the above-mentioned type in such a way that a corresponding miniaturization of the coupling device and of the decoupling device is enabled at low optical losses; at the same time, the manufacturing expenses are to be low.

This object is achieved by a coupling device according to the invention with the herein described features as well as by a decoupling device according to the invention with the herein described features, in particular by a miniaturized active optical transmitting unit and/or by a miniaturized active optical receiving unit. Advantageous embodiments and expedient further developments of the present invention are described above and below.

This object is achieved by a device for coupling optical signals into at least one waveguide, wherein the device comprises at least one send-site circuit, which based on incoming signals from send-site terminal contacts actuates at least one electro-optical converter, which sends out the optical signals in the direction of the axis of the waveguide, wherein the send-site circuit is arranged essentially in the plane of a send-site substrate comprising the send-site terminal contacts.

This object is also achieved by a device for decoupling optical signals from at least one waveguide in at least one opto-electrical converter, which receives the optical signals from the direction of the axis of the waveguide, and transmits them as electrical signals to at least one receive-site circuit, which processes the incoming electrical signals and outputs them to receive-site terminal contacts, wherein the receive-site circuit is arranged essentially in the plane of a receive-site substrate comprising the receive-site terminal contacts.

This object is further achieved by an embodiment of the device according to the invention, wherein the substrate comprises a notch for incorporating the circuit.

This object is further achieved by an embodiment of the device according to the invention, wherein the notch is open toward the front face of the substrate, and dimensioned in such a way that the circuit essentially abuts flush against the front face.

This object is further achieved by an embodiment of the device according to the invention, wherein the notch is embedded into the substrate.

This object is further achieved by an embodiment of the device according to the invention, wherein the height of the circuit is essentially equal to or less than the height of the substrate.

This object is further achieved by an embodiment of the device according to the invention, wherein the converter does not abut flush against the front face of the substrate and/or of the circuit.

This object is further achieved by an embodiment of the device according to the invention, wherein the substrate and/or the circuit comprises a recess for incorporating the converter.

This object is further achieved by an embodiment of the device according to the invention, wherein, in order to achieve an essentially flush fit of the converter, the recess is provided on the front face of the substrate and/or of the circuit.

This object is further achieved by an embodiment of the device according to the invention, wherein the recess is arranged in such a way that the converter is embedded in the substrate, wherein at least one outlet for optical signals, in particular a drilled hole or an optical medium, for example an optical substrate, is provided in the front face of the substrate between the converter and the waveguide.

This object is further achieved by an embodiment of the device according to the invention, wherein at least one bonding surface for securing the converter is arranged on at least one surface, in particular on the front face, of the substrate and/or of the circuit.

This object is further achieved by an embodiment of the device according to the invention, wherein the waveguide can be allocated to the converter by means of a, in particular enveloping, housing.

This object is further achieved by an embodiment of the device according to the invention, wherein at least one guide for aligning the waveguide relative to the converter is arranged inside the housing and/or on the device.

This object is further achieved by an embodiment of the device according to the invention,
wherein the electro-optical converter is at least one laser, in particular at least one vertical cavity surface emitting laser (VCSEL), and/or
wherein the opto-electrical converter is at least one diode, in particular at least one photodiode, and/or
wherein the circuit is at least one application-specific integrated circuit, in particular at least one custom chip.

This object is further achieved by a use of the device according to the invention for forming at least one, in particular pluggable, active optical cable.

According to the present invention, electrical signals received via electrical terminal contacts are processed in at least one circuit. The circuit, which can be designed as an application-specific integrated circuit or application-specific integrated circuit (ASIC), for example as a custom chip, actuates at least one electro-optical converter, in particular at least one laser, for example at least one vertical cavity surface emitting laser (VCSEL), which axially transmits the optical signals to the waveguide, and couples them into this waveguide, for example into at least one glass fiber.

The send-site circuit, electro-optical converter and send-site terminal contacts are here arranged in such a way as to essentially be located in one plane. As opposed to conventional approaches, the flat structural design enables a reduction in the overall height. The manufacture of a flat substrate medium is also advantageous from a production and cost standpoint.

The substrate acts first and foremost as a receiving medium for the send-site circuit, as well as for the send-site terminal contacts, and comprises communication interfaces and electrical connections, so as to enable communication between the individual components.

On the reception side, the incoming optical signals are decoupled by at least one opto-electrical converter from the direction of the axis of the waveguide, in particular of at least one glass fiber. This opto-electrical converter, which can be a diode, in particular a photodiode, converts the optical signals into electrical signals, and outputs the latter to at least one circuit, in particular to at least one application-specific integrated circuit or to at least one application-specific integrated circuit (ASIC), for example to at least one custom chip. The circuit processes, if necessary amplifies, and outputs the signals to terminal contacts.

The receive-site circuit, opto-electrical converter and receive-site terminal contacts are here arranged in such a way as to be located essentially in one plane. As opposed to conventional approaches, the flat structural design enables a reduction in the overall height. The manufacture of a flat substrate medium is also advantageous from a production and cost standpoint.

The substrate acts first and foremost as a receiving medium for the send-site circuit, as well as for the send-site terminal contacts, and comprises communication interfaces and electrical connections, so as to enable communication between the individual components.

In a preferred embodiment of the present invention, the substrate comprises a notch, wherein the dimensions of this notch correspond to the dimensions of the transmission or receive-site circuit. The advantage to this is that the circuit can be fitted into the substrate, and is directly in contact with the lines embedded into the substrate.

In an advantageous further development of the present invention, the notch is designed in such a way as to be open toward the front face that faces away from the terminal contacts. The notch can here be defined in such a way that the circuit abuts flush against the front surface. This option is interesting in particular for production and cost-related reasons.

In an expedient embodiment of the present invention, the notch is enveloped by the substrate in all four directions. This results in a particularly good embedment, and an especially good contact with the connections in the substrate.

In a preferred embodiment of the present invention, the height of the substrate is less than or equal to the height of the circuit, so that the circuit can be completely embedded in the substrate, and in this way better protected against external influences.

In an advantageous further development of the present invention, the converter can be mounted, in particular adhesively bonded, to the front surface, without the converter abutting flush against the front face of the substrate and/or of the circuit. This variant enables a high flexibility in production.

In a preferred embodiment of the present invention, a recess for the converter is provided in the device, in particular in the substrate and/or in the circuit. This enables an improved protection along with a more exact positioning of the converter. In addition, a better connectivity with the connections in the substrate can be established in this way.

In an advantageous embodiment of the present invention, the recess for the converter is designed in such a way that the converter, within the limits of achievable accuracy, abuts flush against the front surface of the substrate and/or of the circuit. This variant makes sense from a production and cost perspective, since it enables the simple and cost-effective manufacture of the device.

In an advantageous further development of the present invention, the recess can be placed in such a way that the converter is embedded in the substrate. In order to make the waveguide or converter accessible for the optical signal, an outlet for optical signals, in particular a drilled hole or optical medium, for example an optical substrate, is expediently provided between the waveguide and converter. A complete embedment affords the converter with better protection against external influences.

In a preferred embodiment of the present invention, at least one bonding surface is secured to at least one surface of the substrate and/or of the circuit, preferably to the front face of the substrate. The bonding surfaces allow power to be supplied to the converter, and in particular abut flush against the substrate and/or against the circuit.

In an advantageous further development of the present invention, it is useful to provide the device with a protective housing, in particular for use as a pluggable, active optical cable. In addition, the housing can take over the function of mechanically fixing in place the optical waveguide and device.

In an advantageous embodiment of the present invention, the housing and/or device can be equipped with at least one guide for the waveguide, so as to facilitate the process of mounting, positioning and fixing the waveguide on the device.

The proposed device for coupling or decoupling optical signals can be beneficially used in numerous areas of application, first and foremost for rapid signal transmission between two components with electrical signal routing.

The present invention thus relates above all to use in building, in particular pluggable, active optical cables for rapid and low-loss signal conversion, as well as data transmission over a very small space, so as to quickly relay the electrically processed data to the various units. The extremely short routing inside the device allows for very short latency periods.

Also conceivable is use as a pluggable active optical cable, so as to connect peripheral devices, wherein the cable in the plug ends processes signals, converts signals, and couples and decouples the input and output signals. It is here also possible to provide bidirectional cables, in particular if the transmitting and receiving components are allocated to a single substrate, or directionally independent cables, if the electro-optical converter is simultaneously also an opto-electrical converter.

In addition, this device makes it possible to realize a new type of structural design for a miniaturized electro-optical transmitter and/or a miniaturized opto-electrical receiver with a fixedly connected optical waveguide for transmitting electrical signals via such an optical waveguide.

The present invention is characterized by a high degree of miniaturization, which can be attributed to the way in which the components are positioned and integrated according to the invention. This makes it possible to construct A[ctive] O[ptical]C[able]s with miniaturized electro-optical transmitters and/or opto-electrical receivers.

By "recessing" or embedding the circuit or converter, in particular the electro-optical transmitter and/or opto-electrical receiver, into the substrate plane or into the substrate, very short signal connecting lengths can be achieved, for example bond wire lengths, which helps maintain signal quality and reduces latency periods, in particular given very high data transmission rates.

In comparison to conventional solutions, the present invention comprises lower optical loss values, since there is no need for deflection elements, boundary surfaces and free jets.

BRIEF DESCRIPTION OF THE DRAWINGS

As already discussed hereinbefore, there are various possibilities for embodying and further developing the teaching of the present invention in an advantageous manner. To this end, on the one hand reference is made to the explanations above and to the dependent claims, and on the other hand further embodiments, features and advantages of the present invention are explained in greater detail below, inter alia by way of the exemplary embodiments illustrated by FIG. 4A to FIG. 10.

It is shown in:

FIG. 1 in a conceptual schematic view, a device according to the prior art, with which optical signals can be coupled at an angle of ninety degrees to the direction of emission;

FIG. 2 in a conceptual schematic view, a device according to the prior art, with which optical signals can be coupled in an axial direction to the waveguide by means of an L-bracket;

FIG. 3 in a perspective view, an example for realizing a coupling or decoupling device according to the prior art;

FIG. 4A in a top view, an exemplary embodiment for a carrier substrate according to the present invention;

FIG. 4B in a perspective view, the carrier substrate of FIG. 4A;

Figure 5:
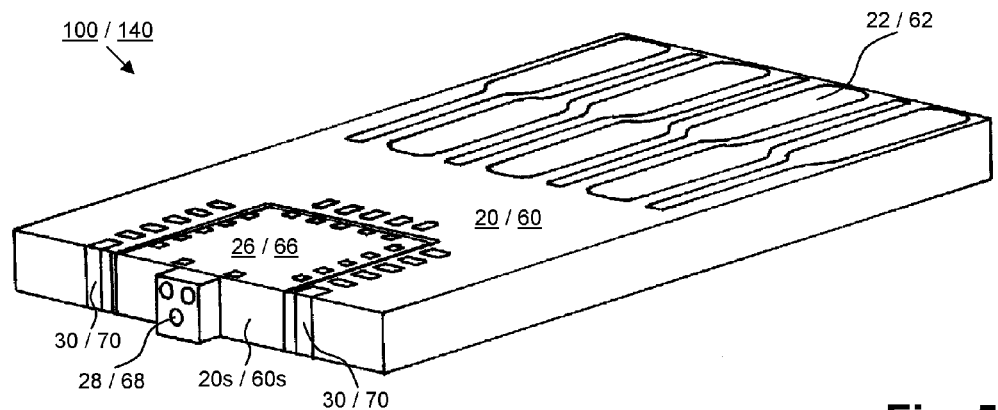
FIG. 5 in a perspective view, a first exemplary embodiment for a device according to the present invention formed with the carrier substrate of FIG. 4A and FIG. 4B.

Like or similar embodiments, elements or features are provided with identical reference numerals in FIG. 4A to FIG. 10. While no graphic distinction is made between the transmission side and the reception side, the receive-site elements corresponding to the send-site elements have a reference numeral that is higher by 40.

DETAILED DESCRIPTION OF THE INVENTION

Figure 6:
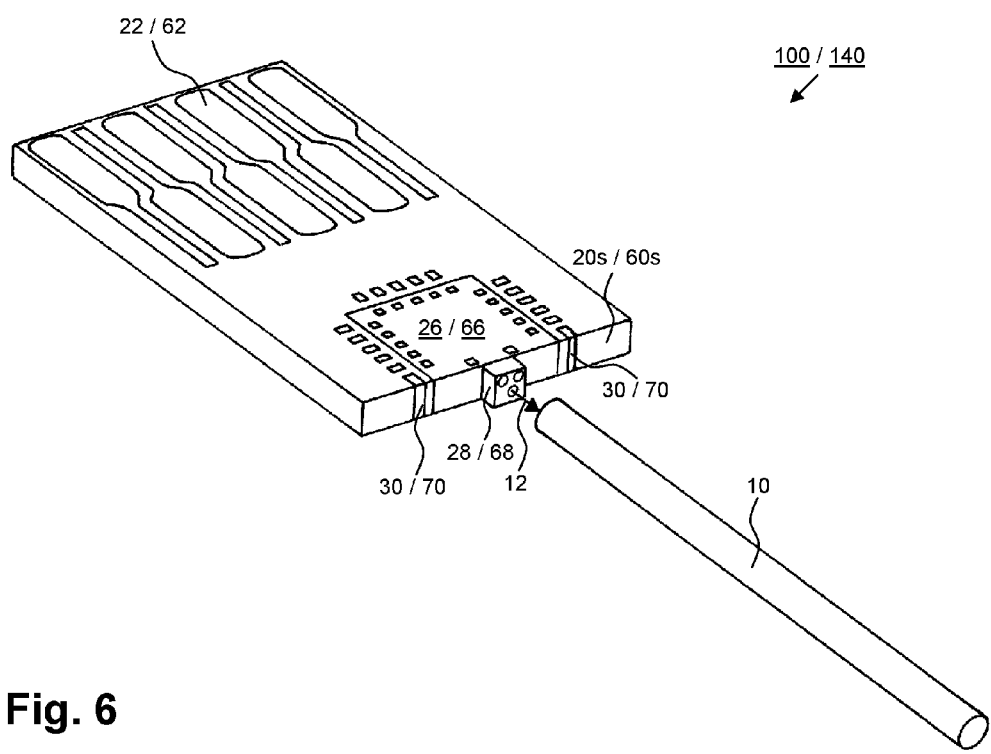
FIG. 6 in a perspective view, the device of FIG. 5 with allocated optical waveguide.
Figure 7:
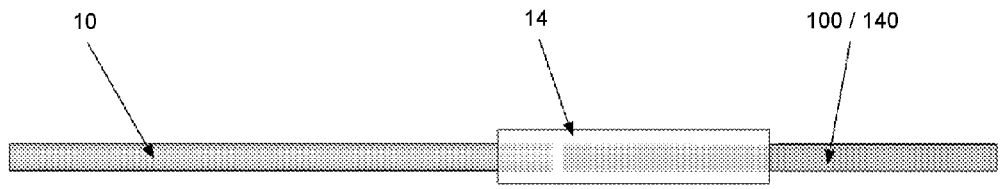
FIG. 7 in a conceptual schematic side view, a device according to the present invention, which is connected with the waveguide of FIG. 6 by means of a housing.
Figure 8:
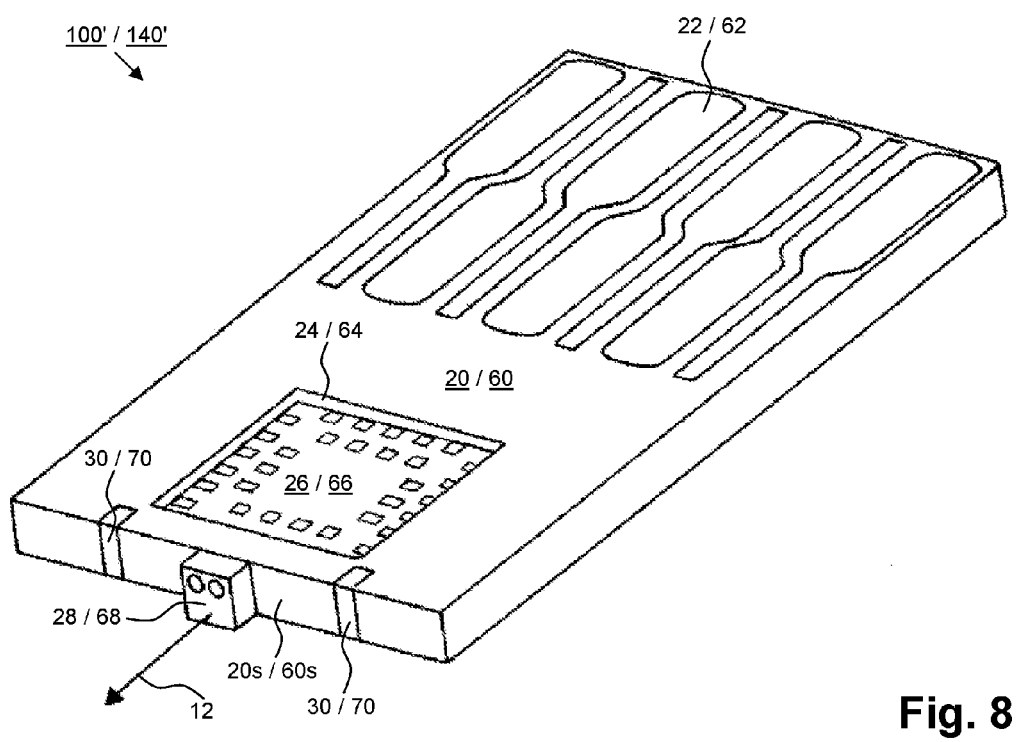
FIG. 8 in a perspective view, a second exemplary embodiment for a device according to the present invention.
Figure 9:
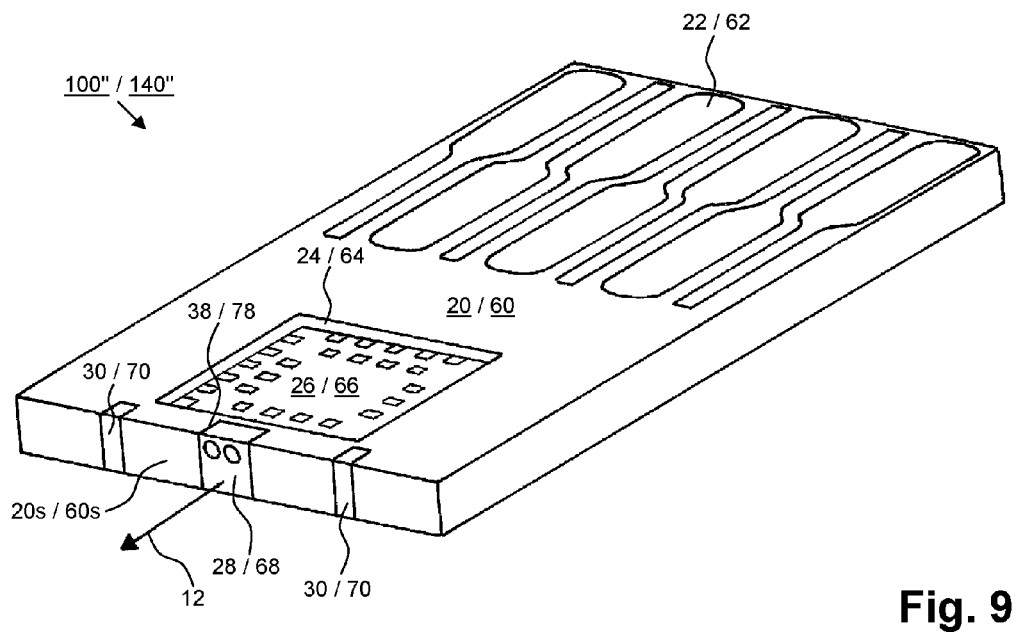
FIG. 9 in a perspective view, a third exemplary embodiment for a device according to the present invention.
Figure 10:
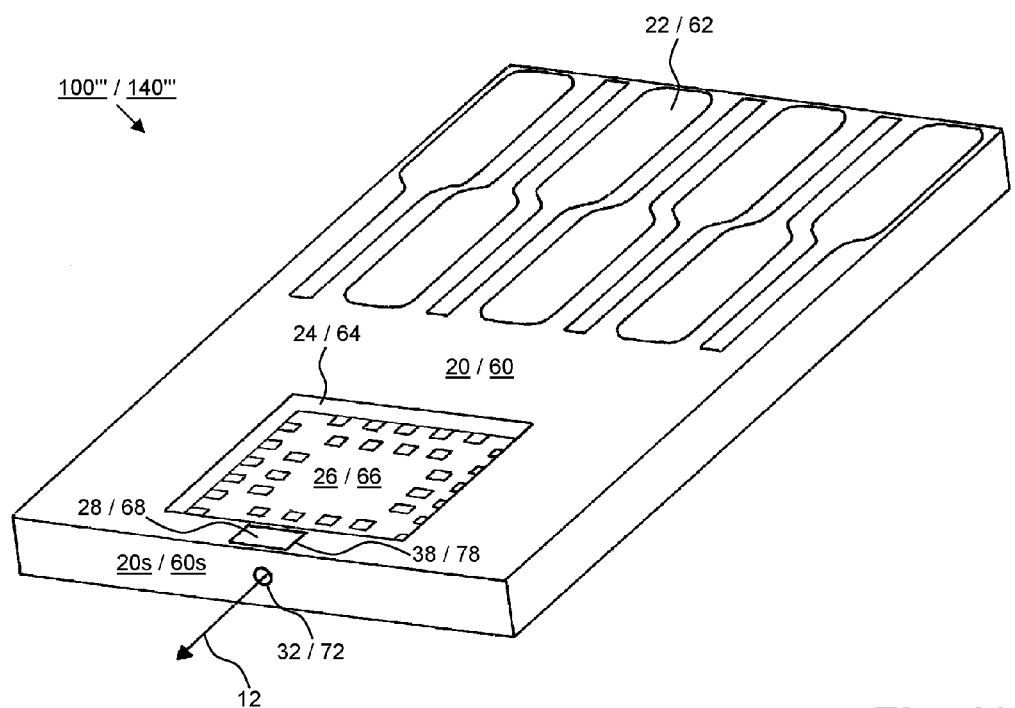
FIG. 10 in a perspective view, a fourth exemplary embodiment for a device according to the present invention.

In order to avoid unnecessary repetitions, the following explanations regarding the embodiments, features and advantages of the present invention—unless specified otherwise—relate to the first exemplary embodiment of a device 100 or 140 according to the invention shown in FIG. 4A to FIG. 7 as well as to the second exemplary embodiment of a device 100' or 140' according to the invention shown in FIG. 8 as well as to the third exemplary embodiment of a device 100" or 140" according to the invention shown in FIG. 9 as well as to the fourth exemplary embodiment of a device 100''' or 140''' according to the invention shown in FIG. 10.

The invention provides a send-site substrate 20 or a receive-site substrate 60. The terminal contacts 22 or 62, which in particular can be metal pressure contacts or sliding contacts, are supported on the substrate 20 or 60, wherein the latter can also be worked, for example infused, into the substrate 20 or 60.

The substrate 20 or 60 in FIG. 4A and in FIG. 4B comprises a notch 24 or 64, which has dimensions roughly corresponding to those of the ASIC 26 or 66 (=application-specific integrated circuit, also referred to as custom chip). The ASIC 26 or 66 is required by the electro-optical converter 28 or by the opto-electrical converter 68 for the respective signal processing.

A corresponding circuit 26 or 66 is integrated into the notch 24 or 64, preferably adhesively bonded or inserted, wherein the height of the substrate 20 or 60 corresponds to about the height of the circuit 26 or 66.

The electro-optical converter 28 or opto-electrical converter 68 is arranged on the front face 20s or 60s of the ASIC 26 or 77 facing away from the substrate 20 or 70 in such a way that the direction of transmission or reception of this electro-optical converter 28 or opto-electrical converter 68 essentially lies perpendicular to the surface of the substrate 20 or 60 (cf. FIG. 5).

The optical opening of the electro-optical converter 28 or opto-electrical converter 68 thus points in an axial direction 12 toward the optical waveguide 10 (cf. FIG. 6).

As may further be taken from FIG. 6, two respective bonding surfaces 30 or 70 for connecting the electro-optical converter 28 or opto-electrical converter 68 are arranged on the front face 20s or 60s of the substrate 20 or 70, in particular incorporated or infused into the substrate 20 or 60.

As shown on FIG. 7, the optical waveguide 10 can be mechanically arranged, in particular fastened, on the substrate 20 or 60 by means of an enveloping housing 14. It can here be advantageous to incorporate a guide for the waveguide 10 into this housing 14, which facilitates the process of aligning the waveguide 10 relative to the electro-optical converter 28 or opto-electrical converter 68 during assembly. Alternatively, this guide can be secured to the device itself.

As opposed to the first exemplary embodiment according to FIG. 4A to FIG. 7, the ASIC 26 or 66 provided for signal processing and amplification can also be completely or fully embedded, in particular fitted, for example adhesively bonded, in the substrate 20 or 60, as evident from the second exemplary embodiment according to FIG. 8.

The height of the ASIC 26 or 66 is here somewhat less than the height of the substrate 20 or 60, so that, while the ASIC 26 or 66 is essentially arranged in the plane of the substrate 20 or 60, its surface is slightly recessed in the notch 24 or 64 relative to the surface of the substrate 20 or 60.

If the height of the ASIC 26 or 66 is essentially equal to the height of the substrate 20 or 60, the ASIC 26 or 66 is arranged in the plane of the substrate 20 or 60.

According to this exemplary embodiment on FIG. 8, the electro-optical transmission unit 28 or opto-electrical reception unit 68 is arranged on the front face 20s or 60s of the substrate 20 or 60, so that the transmission or reception direction 12 essentially lies perpendicular to the front surface 20s or 60s, and the optical opening of the converter 28 or 68 simultaneously points in the direction of the optical waveguide 10 or optical fiber.

In a slightly modified manner compared to the second exemplary embodiment on FIG. 8, the electro-optical converter 28 or opto-electrical converter 68 according to the third exemplary embodiment on FIG. 9 can be arranged in a recess 38 or 78 corresponding to its dimensions on the front face 20s or 60s of the substrate 20 or 60.

The height of the ASIC 26 or 66 is here somewhat less than the height of the substrate 20 or 60, so that, while the ASIC 26 or 66 is essentially arranged in the plane of the substrate 20 or 60, its surface is slightly recessed in the notch 24 or 64 relative to the surface of the substrate 20 or 60.

If the height of the ASIC 26 or 66 is essentially equal to the height of the substrate 20 or 60, the ASIC 26 or 66 is arranged in the plane of the substrate 20 or 60.

According to this exemplary embodiment on FIG. 9, the electro-optical transmission unit 28 or opto-electrical reception unit 68 is aligned in such a way that the transmission or reception direction 12 essentially lies perpendicular to the front face 20s or 60s, and the optical opening of the converter 28 or 68 simultaneously points in the direction of the optical waveguide 10 or optical fiber.

In a slightly modified manner compared to the second exemplary embodiment on FIG. 8 and the third exemplary embodiment on FIG. 9, the electro-optical converter 28 or opto-electrical converter 68 according to the fourth exemplary embodiment on FIG. 10 as well as the ASIC 26 or 66 can be completely or fully embedded or fitted into the substrate 20 or 60.

The height of the ASIC 26 or 66 is here somewhat less than the height of the substrate 20 or 60, so that, while the ASIC 26 or 66 is essentially arranged in the plane of the substrate 20 or 60, its surface is slightly recessed in the notch 24 or 64 relative to the surface of the substrate 20 or 60.

If the height of the ASIC 26 or 66 is essentially equal to the height of the substrate 20 or 60, the ASIC 26 or 66 is arranged in the plane of the substrate 20 or 60.

According to this exemplary embodiment on FIG. 10, the optical output of the electro-optical transmission unit 28 or the optical input of the opto-electrical reception unit 68 can be accessed by means of an optical outlet 32 or 72 in the form of a drilled hole or an optical substrate on the front face 20s or 60s of the substrate 20 or 60.

The opening 32 or 72 on the front face 20s or 60s of the substrate 20 or 60 is aligned on FIG. 10 in such a way that the transmission or reception direction 12 of this embedded electro-optical converter 28 or opto-electrical converter 68 lies essentially perpendicular to the front face 20s or 60s, i.e. the optical opening of the converter 28 or 68 points in the direction 12 of the optical waveguide 10 or the optical fiber.

LIST OF REFERENCE NUMERALS

10 waveguide
12 axial direction of waveguide 10
14 housing
20 send-site substrate, in particular send-site printed circuit board
20s front face of send-site substrate 20
22 send-site terminal contact
24 send-site notch for incorporating send-site circuit 26
26 send-site circuit, in particular send-site application-specific integrated circuit (ASIC), for example send-site custom chip
28 electro-optical converter, in particular active optical transmission unit
30 bonding surfaces of electro-optical converter 28
32 send-site optical outlet
38 send-site recess for incorporating electro-optical converter 28
60 receive-site substrate, in particular receive-site printed circuit board
60s front face of receive-site substrate 60
62 receive-site terminal contact
64 receive-site notch for incorporating receive-site circuit 66
66 receive-site circuit, in particular receive-site application-specific integrated circuit (ASIC), for example receive-site custom chip
68 opto-electrical converter, in particular active optical reception unit
70 bonding surfaces of opto-electrical converter 68
72 receive-site optical outlet
78 receive-site recess for incorporating opto-electrical converter 68
100 send-site device (=first exemplary embodiment; cf. FIG. 4A to FIG. 7)
100' send-site device (=second exemplary embodiment; cf. FIG. 8)
100" send-site device (=third exemplary embodiment; cf. FIG. 9)
100''' send-site device (=fourth exemplary embodiment; cf. FIG. 10)
140 receive-site device (=first exemplary embodiment; cf. FIG. 4A to FIG. 7)
140' receive-site device (=second exemplary embodiment; cf. FIG. 8)

140" receive-site device (=third exemplary embodiment; cf. FIG. 9)
140'" receive-site device (=fourth exemplary embodiment; cf. FIG. 10)
ASIC circuit, in particular application-specific integrated circuit (ASIC), for example custom chip (=prior art; cf. FIG. 1 and FIG. 2)
HA bracket (=prior art; cf. FIG. 2)
SI optical signal (=prior art; cf. FIG. 1 and FIG. 2)
US deflection mirror (=prior art; cf. FIG. 1)
WA optical converter (=prior art; cf. FIG. 1 and FIG. 2)
WL optical waveguide (=prior art; cf. FIG. 1 and FIG. 2)

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A device for coupling optical signals into at least one waveguide, wherein the device comprises at least one electro-optical converter and at least one send-site circuit, which based on incoming signals from send-site terminal contacts actuates the at least one electro-optical converter, which sends out the optical signals in the direction of the axis of the waveguide, wherein the send-site circuit is arranged essentially in the plane of a send-site substrate comprising the send-site terminal contacts, and at least one bonding surface for securing the electro-optical converter is arranged on a front face of the send-site substrate or the send-site circuit, and wherein the height of the circuit is essentially equal to or less than the height of the substrate.

2. The device according to claim 1, wherein the substrate comprises a notch for incorporating the circuit.

3. The device according to claim 2, wherein the notch is embedded into the substrate or is open toward the front face of the substrate, and dimensioned in such a way that the circuit essentially abuts flush against the front face.

4. The device according to claim 1, wherein the converter does not abut flush against the front face of the substrate or of the circuit or, in order to achieve an essentially flush fit of the converter, a recess is provided on the front face of the substrate or of the circuit.

5. The device according to claim 4, wherein the recess is arranged in such a way that the converter is embedded in the substrate, wherein at least one outlet for optical signals is provided in the front face of the substrate between the converter and the waveguide.

6. The device according to claim 1, wherein the waveguide can be allocated to the converter by means of a housing, wherein at least one guide for aligning the waveguide relative to the converter is arranged inside the housing or on the device.

7. The device according to claim 1, wherein the electro-optical converter is at least one laser, and wherein the circuit is at least one application-specific integrated circuit (ASIC).

8. Use of at least one device according to claim 1 for forming at least one active optical cable.

9. A device comprising at least one opto-electrical converter and at least one receive-site circuit, wherein the device is for decoupling optical signals from at least one waveguide in the at least one opto-electrical converter, which receives the optical signals from the direction of the axis of the waveguide, and transmits them as electrical signals to the at least one receive-site circuit, which processes the incoming electrical signals and outputs them to receive-site terminal contacts, wherein the receive-site circuit is arranged essentially in the plane of a receive-site substrate comprising the receive-site terminal contacts, and at least one bonding surface for securing the opto-electrical converter is arranged on a front face of the receive-site substrate or the receive-site circuit, and wherein the height of the circuit is essentially equal to or less than the height of the substrate.

10. The device according to claim 9, wherein the substrate comprises a notch for incorporating the circuit.

11. The device according to claim 10, wherein the notch is embedded into the substrate or is open toward the front face of the substrate, and dimensioned in such a way that the circuit essentially abuts flush against the front face.

12. The device according to claim 9, wherein the converter does not abut flush against the front face of the substrate or of the circuit or, in order to achieve an essentially flush fit of the converter, a recess is provided on the front face of the substrate or of the circuit.

13. The device according to claim 12, wherein the recess is arranged in such a way that the converter is embedded in the substrate, wherein at least one outlet for optical signals is provided in the front face of the substrate between the converter and the waveguide.

14. The device according to claim 9, wherein the waveguide can be allocated to the converter by means of a housing, wherein at least one guide for aligning the waveguide relative to the converter is arranged inside the housing or on the device.

15. The device according to claim 9, wherein the opto-electrical converter is at least one diode, and wherein the circuit is at least one application-specific integrated circuit (ASIC).

16. Use of at least one device according to claim 9 for forming at least one active optical cable.

* * * * *